United States Patent
Hsu et al.

(10) Patent No.: US 10,083,976 B2
(45) Date of Patent: Sep. 25, 2018

(54) NONVOLATILE MEMORY WITH ERASE GATE REGION

(71) Applicant: eMemory Technology Inc., Hsin-Chu (TW)

(72) Inventors: Chia-Jung Hsu, Taoyuan (TW); Wein-Town Sun, Taoyuan (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/825,113

(22) Filed: Nov. 29, 2017

(65) Prior Publication Data

US 2018/0197875 A1    Jul. 12, 2018

Related U.S. Application Data

(60) Provisional application No. 62/444,379, filed on Jan. 10, 2017.

(51) Int. Cl.

| | |
|---|---|
| *H01L 27/00* | (2006.01) |
| *H01L 27/11558* | (2017.01) |
| *H01L 29/78* | (2006.01) |
| *G11C 16/34* | (2006.01) |
| *G11C 16/04* | (2006.01) |

(52) U.S. Cl.
CPC .... *H01L 27/11558* (2013.01); *G11C 16/0433* (2013.01); *G11C 16/3472* (2013.01); *H01L 29/7841* (2013.01)

(58) Field of Classification Search
CPC ......... H01L 27/11548; H01L 27/11524; H01L 27/11526; H01L 27/11558; H01L 29/7841; G11C 16/0433; G11C 16/3472
See application file for complete search history.

(56) References Cited

U.S. PATENT DOCUMENTS

| | | | |
|---|---|---|---|
| 8,658,495 B2 | 2/2014 | Hsu | |
| 8,941,167 B2 | 1/2015 | Chen | |
| 9,099,392 B2 | 8/2015 | Hsu | |
| 9,472,565 B2* | 10/2016 | Park | ................. H01L 29/42328 |
| 9,508,447 B2* | 11/2016 | Hsu | ........................ G11C 16/14 |
| 2015/0091074 A1* | 4/2015 | Hsu | ........................ G11C 5/147 |
| | | | 257/316 |
| 2015/0287732 A1* | 10/2015 | Tsao | ........................ G11C 5/06 |
| | | | 257/319 |

* cited by examiner

*Primary Examiner* — Yosef Gebreyesus
(74) *Attorney, Agent, or Firm* — Winston Hsu (57) ABSTRACT

A nonvolatile memory (NVM) cell includes a semiconductor substrate having a first OD region and a second OD region for forming an erase gate (EG) region. The second OD region is spaced apart from the first OD region and is separated from the first OD region by a trench isolation region. A select transistor is disposed on the first OD region. A floating gate transistor is serially connected to the select transistor and is also disposed on the first OD region. The floating gate transistor includes a floating gate overlying the first OD region. A first floating gate extension continuously extends from the floating gate to the second OD region. The first floating gate extension comprises a P+ doped segment and an N+ doped segment with a P+/N+ interface therebetween.

17 Claims, 7 Drawing Sheets

NONVOLATILE MEMORY WITH ERASE GATE REGION

CROSS REFERENCE TO RELATED APPLICATIONS

This application claims the benefit of U.S. provisional application No. 62/444,379 filed Jan. 10, 2017.

BACKGROUND OF THE INVENTION

1. Field of the Invention

The present invention relates to the field of nonvolatile memory devices. More specifically, the present invention relates to a multi-time programmable (MTP) memory with improved erase performance.

2. Description of the Prior Art

Semiconductor memory devices have become more popular for use in various electronic devices. For example, non-volatile memory (NVM) is widely used in cellular telephones, digital cameras, personal digital assistants, mobile computing devices, and other applications.

Generally, NVM may be divided into multi-time programmable (MTP) memory and one-time programmable (OTP) memory. MTP memory is multi-readable and multi-writable. For example, EEPROM and flash memory are designedly equipped with some corresponding electric circuits to support different operations such as programming, erasing and reading. OTP functions perfectly with electric circuits with mere programming and reading functions. Electric circuits for erasing operation are not required in OTP.

Single-poly NVM designs have been proposed which reduce the additional processing cost. A single-poly NVM forms the charge-storage floating gate with a single layer of polysilicon. Because the single-poly NVM is compatible with regular CMOS process, it is applied in the field of embedded memory, embedded nonvolatile memory in the mixed-mode circuits and micro-controllers (such as System on Chip, SOC).

It is known that programming of memory cell can be accomplished by hot electron injection techniques (also known as channel hot electron or CHE programming) and may be erased by FN tunneling via an erase gate. Typically, to achieve better erase performance, it is needed to enlarge the cell size in order to obtain higher coupling ratio.

SUMMARY OF THE INVENTION

It is one object of the invention to provide a single-poly non-volatile memory (NVM) with an erase gate and improved erase efficiency.

According to one aspect of the invention, a nonvolatile memory (NVM) cell includes a semiconductor substrate, a first oxide define (OD) region in the semiconductor substrate, and a second oxide define (OD) region for forming an erase gate (EG) region. The second OD region is spaced apart from the first OD region and is separated from the first OD region by a trench isolation region. A select transistor is disposed on the first OD region. A floating gate transistor is serially connected to the select transistor and is also disposed on the first OD region. The floating gate transistor comprises a floating gate overlying the first OD region. A first floating gate extension continuously extends from the floating gate to the second OD region. The first floating gate extension comprises a $P^+$ doped segment and an $N^+$ doped segment with a $P^+/N^+$ interface therebetween. The $P^+/N^+$ interface is situated closer to the first OD region.

According to one embodiment, the floating gate is a $P^+$ doped polysilicon gate. The distance a between the $P^+/N^+$ interface and the first OD region is smaller than the distance b between the $P^+/N^+$ interface and the second OD region. According to one embodiment, b/a ranges between 5 and 20.

According to one embodiment, the NVM cell further comprises a second floating gate extension continuously extending from the first floating gate extension. The second floating gate extension protrudes from a side edge of the first floating gate extension and completely overlaps with the trench isolation region between the first OD region and the second OD region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations or process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The term "oxide define (OD) region" ("OD" region is sometimes referred to as "oxide defined" region or "oxide definition" region) is commonly known in this technical field to be defined as a region on a silicon main surface of a substrate other than a local oxidation of silicon (LOCOS) or a shallow trench isolation (STI) region. The term "oxide define (OD) region" is also commonly referred to as an "active area" where the active circuit elements such as transistors are formed and operated.

Figure 1:
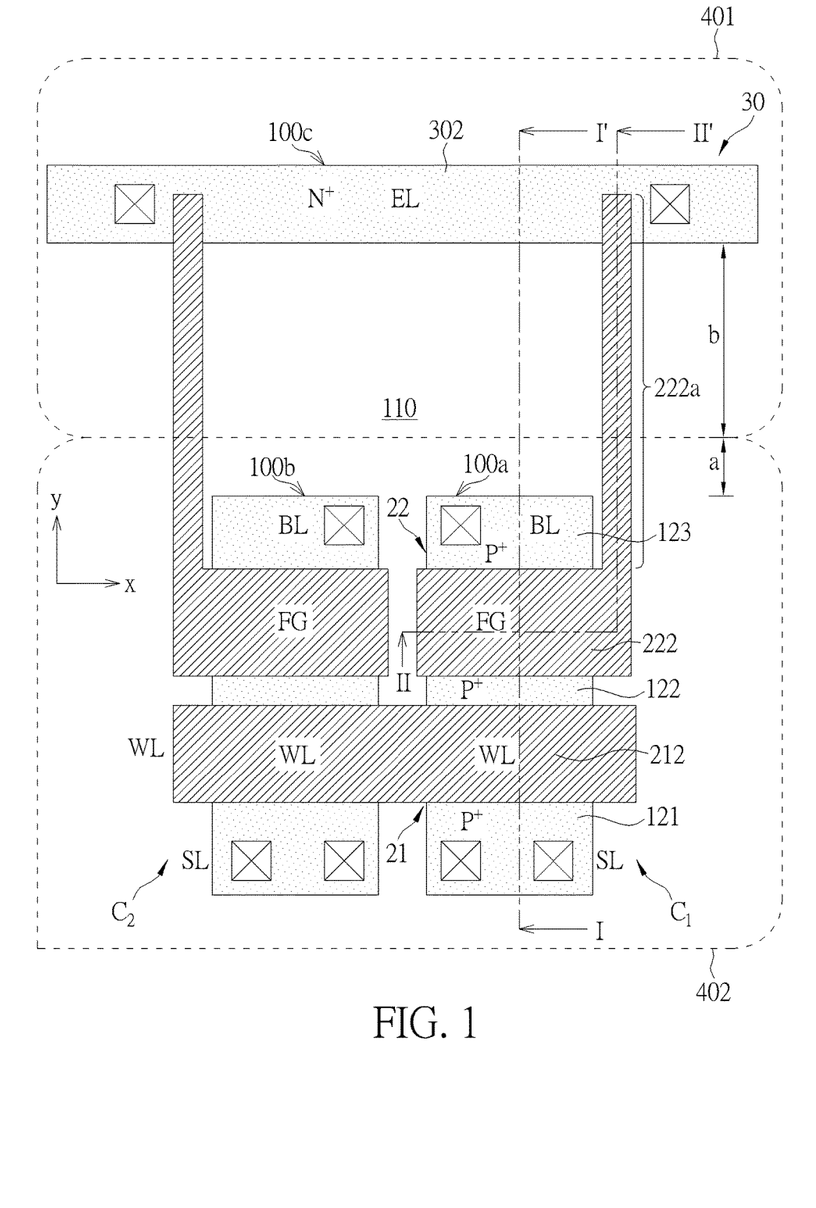
FIG. 1 is a schematic plan view showing an exemplary layout of a single-poly nonvolatile memory cell in accordance with one embodiment of this invention.
Figure 2:
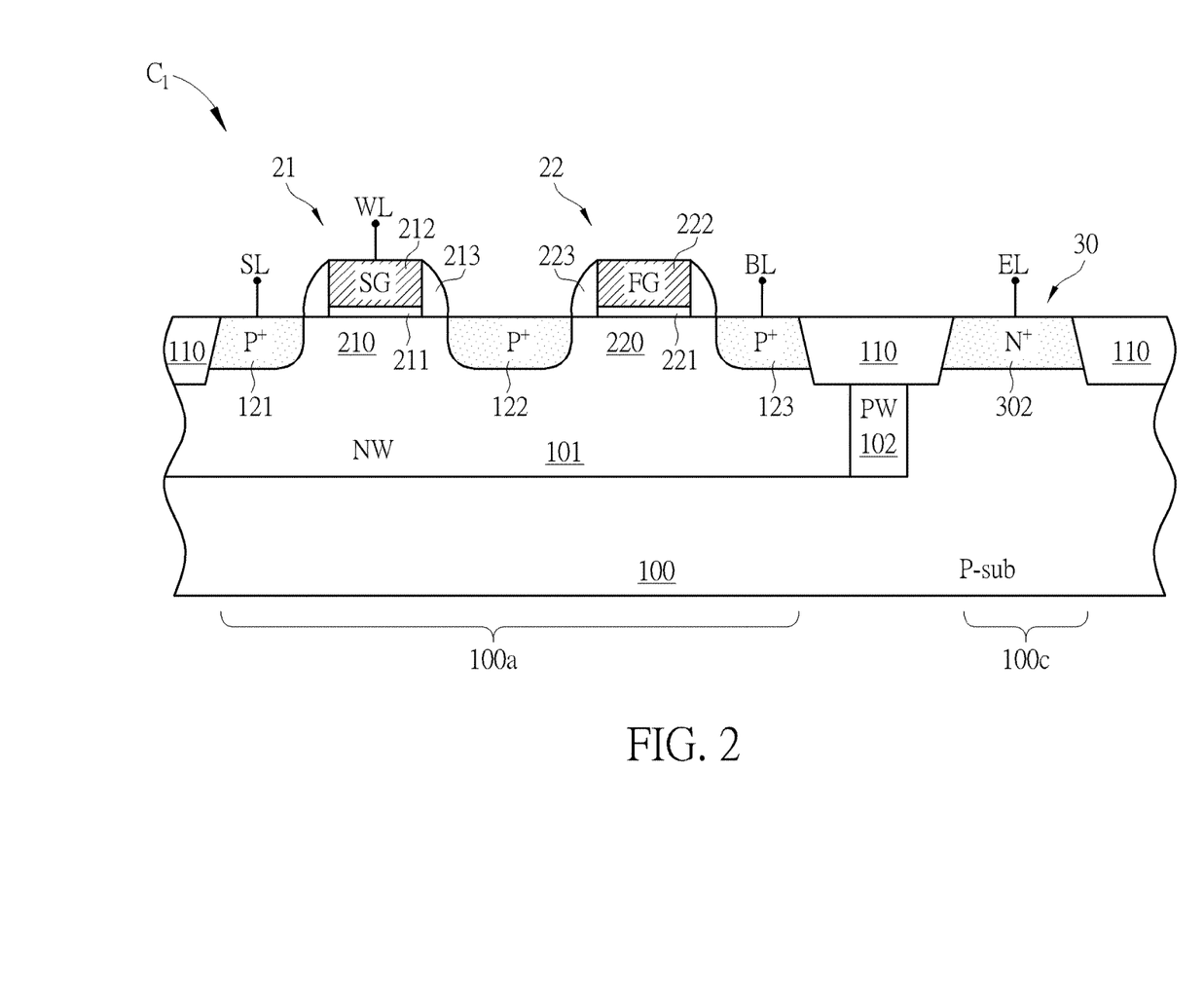
FIG. 2 is a schematic, cross-sectional view taken along line I-I' of FIG. 1.
Figure 3:
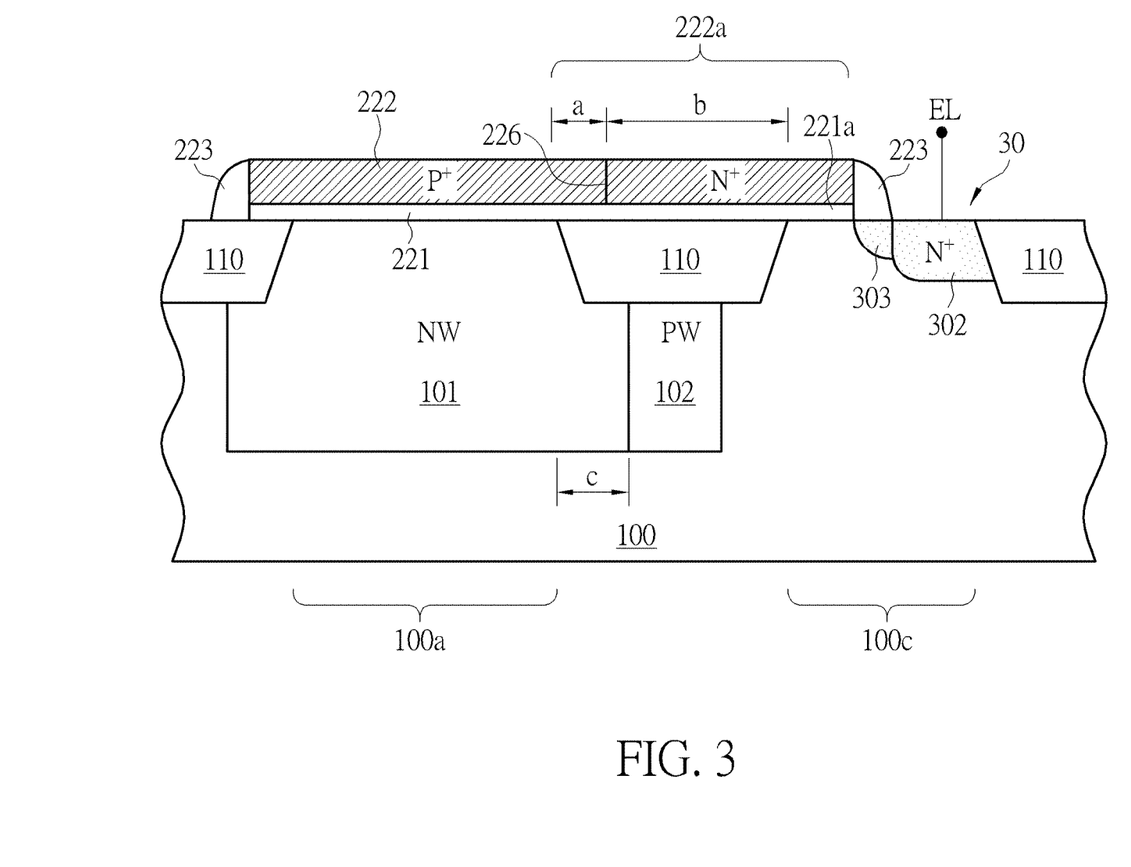
FIG. 3 is a schematic, cross-sectional view taken along line II-II' of FIG. 1.

FIG. 1 is a schematic plan view showing an exemplary layout of a single-poly nonvolatile memory (NVM) cell in accordance with one embodiment of this invention. FIG. 2 is a schematic, cross-sectional view taken along line I-I' of FIG. 1. FIG. 3 is a schematic, cross-sectional view taken along line II-II' of FIG. 1. The demonstrated NVM cell structure may function as a multi-time programmable (MTP) memory unit. It is to be understood that the present invention may be applicable to other memory devices.

As shown in FIG. 1, the two NVM cells $C_1$ and $C_2$ are fabricated on two isolated oxide define (OD) regions 100a and 100b, respectively. The OD region 100a is separated from the OD region 100b by a trench isolation region 110 that is formed in a main surface of a semiconductor substrate 100 of a first conductivity type such as a P type doped silicon substrate (P-Sub). According to the illustrative embodiment, the trench isolation region 110 may be a shallow trench isolation (STI) region, but should not be limited thereto.

According to the illustrative embodiment, the NVM cell $C_1$ is mirror symmetric to the NVM cell $C_2$. However, it is understood that the NVM cell $C_1$ may not be mirror symmetric to the NVM cell $C_2$ according to other embodiments. For the sake of simplicity, only the NVM cell $C_1$ will be discussed in greater detail. It is to be understood that the layout in FIG. 1 is for illustrative purposes only. The present invention may be applicable to other layout designs.

As shown in FIG. 1 and FIG. 2, according to the illustrative embodiment, the OD region 100a and the OD region 100b are formed within the same ion well 101 of a second conductivity type such as an N well (NW). According to another embodiment, a deep N well may be provided in the semiconductor substrate 100 and the ion well 101 may be disposed above the deep N well. The NVM cell $C_1$ comprises a select transistor 21 and a floating gate transistor 22 serially connected to the select transistor 21. The serially connected select transistor 21 and the floating gate transistor 22 may be formed directly on the OD region 100a.

According to the illustrative embodiment, the select transistor 21 may be a PMOS transistor and comprises a source doping region 121 in the ion well 101, a common doping region 122 spaced apart from the source doping region 121, a select gate channel region 210 near the main surface of the semiconductor substrate 100 between the source doping region 121 and the common doping region 122, a select gate (SG) 212 overlying the select gate channel region 210, and a gate dielectric layer 211 between the select gate 212 and the select gate channel region 210. The select gate (SG) 212 is coupled to a word line (WL). According to the illustrative embodiment, the select gate (SG) 212 may be a P+ doped polysilicon gate. Sidewall spacers 213 may be formed on opposite sidewalls of the select gate 212.

According to the illustrative embodiment, the source doping region 121 and the common doping region 122 may have the first conductivity type. For example, the source doping region 121 and the common doping region 122 may be P+ doping regions. According to the illustrative embodiment, the source doping region 121 may be electrically coupled to a source line SL.

The floating gate transistor 22 is formed directly on the OD region 100a. The floating gate transistor 22 is serially coupled to the select transistor 21 through the common doping region 122. The common doping region 122 is shared by the floating gate transistor 22 and the select transistor 21, thereby forming two serially connected transistors 21 and 22, and in this illustrative case, two serially connected PMOS transistors.

The floating gate transistor 22 comprises a floating gate (FG) 222 overlying the OD region 100a. According to the illustrative embodiment, the floating gate 222 consists of a single layer of polysilicon, for example, P+ doped polysilicon. According to the illustrative embodiment, the floating gate 222 is a single-poly gate. That is, no additional gate layer is stacked on the floating gate 222. According to the illustrative embodiment, the floating gate transistor 22 serves as the charge storage element of the NVM cell $C_1$. According to the illustrative embodiment, the word line (WL) may have a straight line-shaped conductive pattern and extend along a first direction or a reference x-axis. According to the illustrative embodiment, the portions of the word line WL that directly overlaps with the OD regions are deemed as the select gates.

The floating gate transistor 22 further comprises the common doping region 122 on one side of the floating gate (FG) 222, a drain doping region 123 on the other side of the floating gate 222 that is opposite to the common doping region 122, a floating gate channel region 220 between the common doping region 122 and the drain doping region 123, and a gate dielectric layer 221 between the floating gate 222 and the floating gate channel region 220. Sidewall spacers 223 may be formed on opposite sidewalls of the floating gate 222.

According to the illustrative embodiment, the drain doping region 123 may have the first conductivity type. For example, the drain doping region 123 may be a P+ doping region and may be electrically coupled to a bit line BL.

According to the illustrative embodiment, as can be seen in FIG. 2, the gate dielectric layer 221 may have a thickness that is equal to that of the gate dielectric layer 211. According to the illustrative embodiment, the select transistor 21 and the floating gate transistor 22 share the same ion well 101.

As can be seen in FIG. 1 and FIG. 3, according to the illustrative embodiment, the NVM cell $C_1$ further comprises a floating gate extension 222a continuously extending from the floating gate 222 to an OD region 100c and is adjacent to an erase gate (EG) region 30, which is coupled to an erase line EL. The floating gate extension 222a traverses the trench isolation region 110 between the OD region 100a and the OD region 100c and partially overlaps with the OD region 100c so as to capacitively couple to the EG region 30. The floating gate extension 222a may have a slender shape when viewed from the above and extends along a second direction or a reference y-axis.

According to the illustrative embodiment, the floating gate extension 222a may comprise a P+ doped segment and an N+ doped segment with a P+/N+ interface 226 therebetween. The P+ doped segment is contiguous with the N+ doped segment. The distal end of the N+ doped segment of the floating gate extension 222a is capacitively coupled to the EG region 30.

According to the illustrative embodiment, the P+/N+ interface 226 is situated closer to the OD region 100a and farther from the OD region 100c. That is, the distance a between the P+/N+ interface 226 and the OD region 100a is smaller than the distance b between the P+/N+ interface 226 and the OD region 100c. According to the illustrative embodiment, b/a may range between 5 and 20, but is not limited thereto. The N+ implant region 401 and the P+ implant region 402 are also shown in FIG. 1 as indicated in dashed line. According to the illustrative embodiment, the distance a may be smaller than or equal to the overlapping region denoted as letter c between the ion well 101 and the trench isolation region 110 between the OD region 100a and the OD region 100c.

According to the illustrative embodiment, an isolation ion well 102 of the first conductivity type such as a P well may be disposed under the trench isolation region 110 between the OD region 100a and the OD region 100c. The EG region 30 may comprise a heavily doped region 302 of the second conductivity type such as an N+ doping region adjacent to the floating gate extension 222a. A lightly doped drain (LDD) region 303 such as an NLDD may be disposed in the semiconductor substrate 100 and may be situated directly under the spacer 223. The LDD region 303 is contiguous with the heavily doped region 302.

According to the illustrative embodiment, a gate dielectric layer 221a may be formed between the floating gate extension 222a and the semiconductor substrate 100. According to the illustrative embodiment, the heavily doped region 302 is formed in an area that is not covered by the floating gate extension 222a. In operation, such as an erase operation, the heavily doped region 302 is electrically coupled to an erase line voltage ($V_{EL}$).

By providing a greater distance b between the P+/N+ interface 226 and the OD region 100c (or greater b/a ratio), the area of N+ doped segment of the floating gate extension 222a may be formed as large as possible. The enlarged proportion of N+ doped segment of the floating gate extension 222a can enhance the erase efficiency because more electrons are located at the conduction band of the enlarged proportion of N+ doped segment of the floating gate extension 222a and it becomes easier to pull electrons out of the N+ doped segment. Moreover, more electrons of the P+ doped segment of the floating gate extension 222a are pulled to neutralize the holes of the N doped segment resulted from the pulling out of the electrons of the N+ doped segment. Thereafter, the erase efficiency is highly enhanced.

Figure 4:
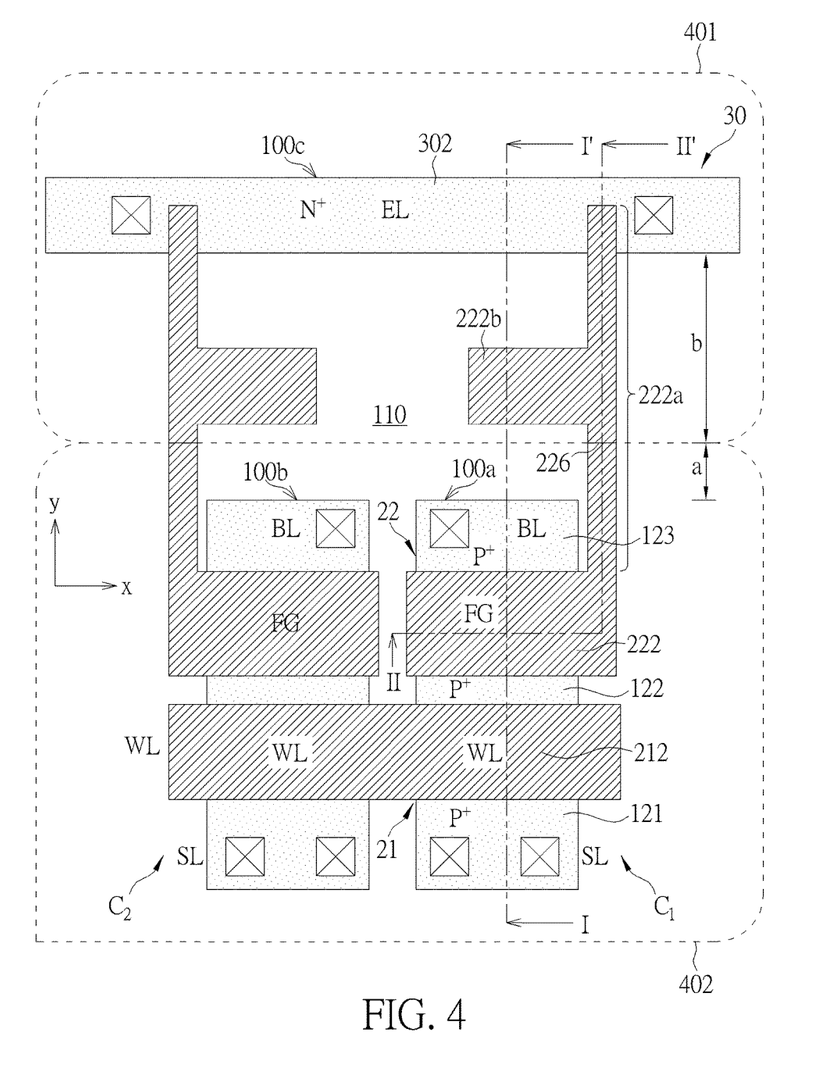
FIG. 4 is a schematic plan view showing an exemplary layout of a single-poly NVM cell in accordance with another embodiment of this invention.
Figure 5:
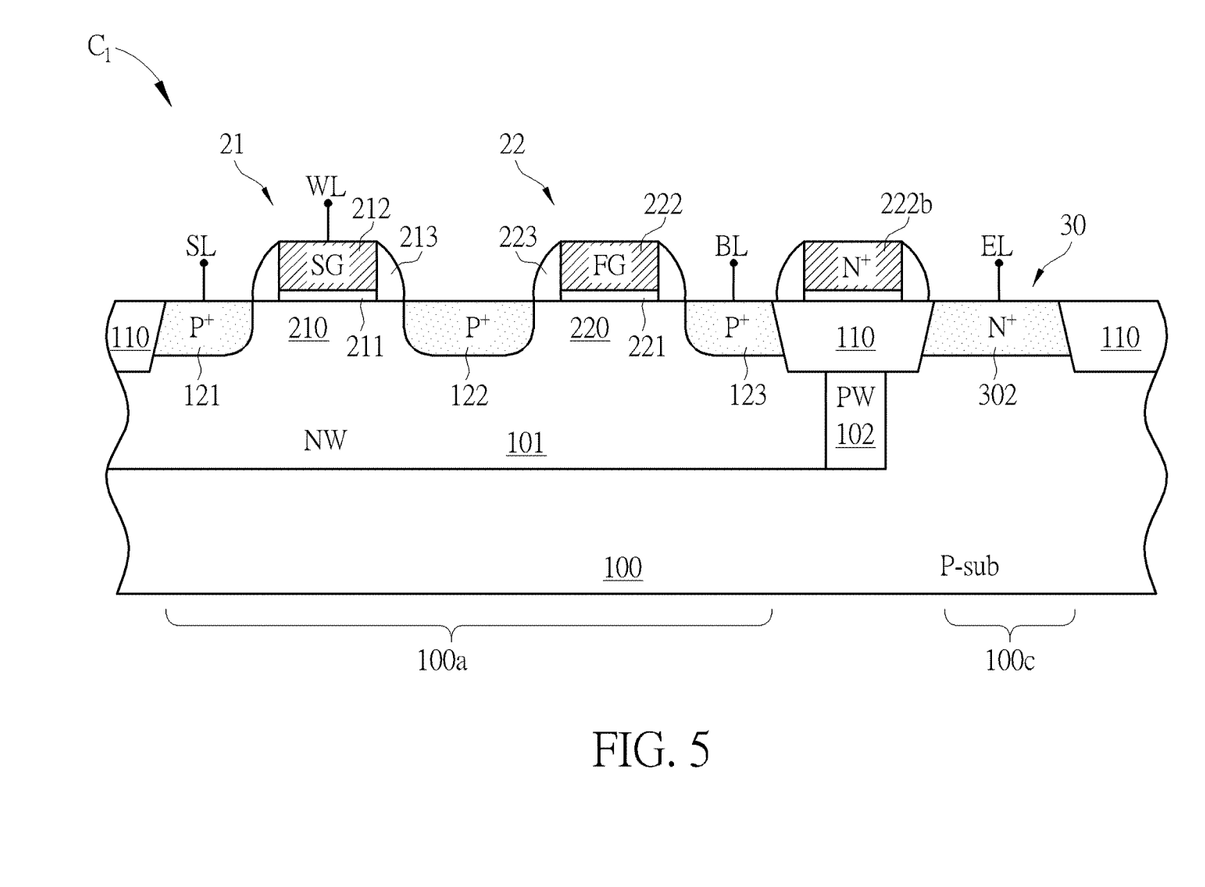
FIG. 5 is a schematic, cross-sectional view taken along line I-I' of FIG. 4.
Figure 6:
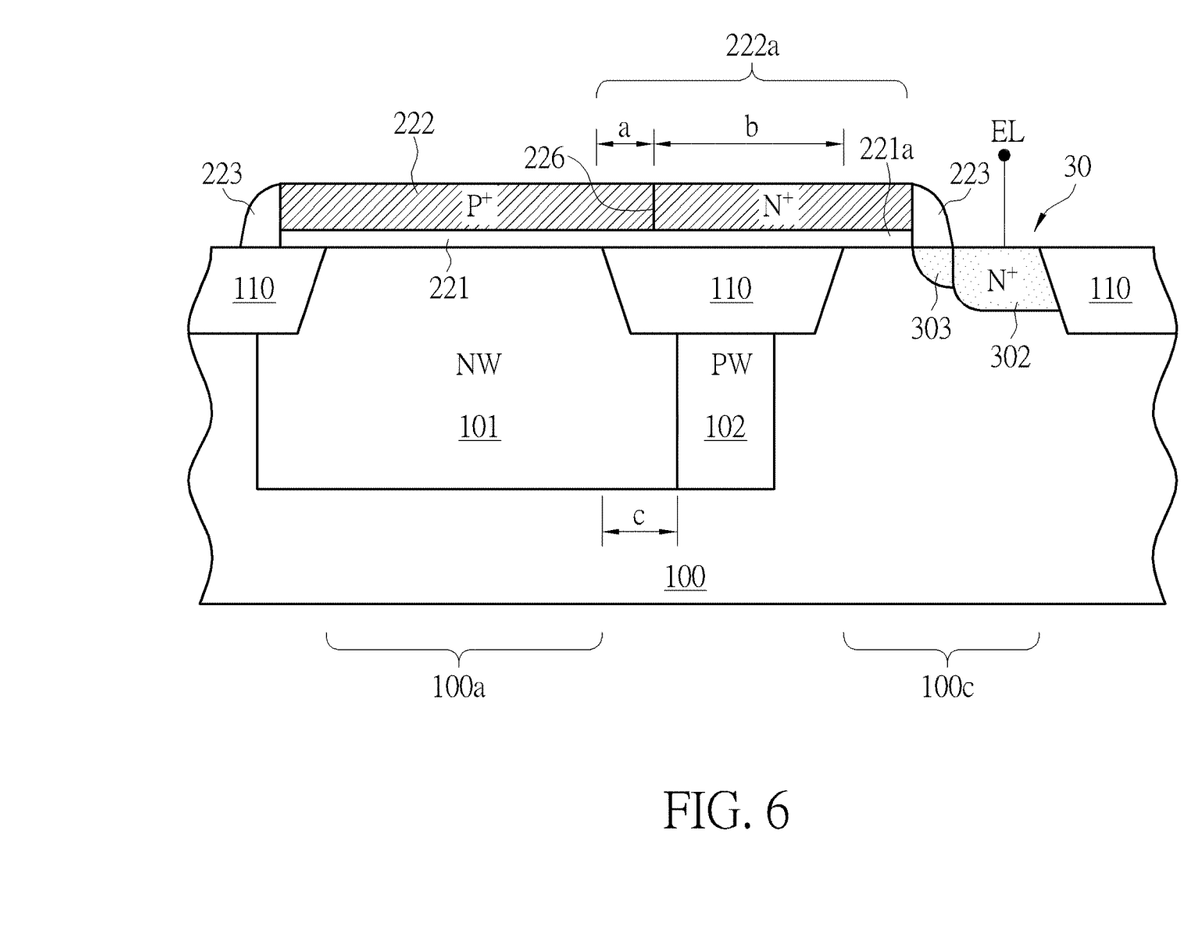
FIG. 6 is a schematic, cross-sectional view taken along line II-II' of FIG. 4.

Please refer to FIG. 4 to FIG. 6. FIG. 4 is a schematic plan view showing an exemplary layout of a single-poly NVM cell in accordance with another embodiment of this invention. FIG. 5 is a schematic, cross-sectional view taken along line I-I' of FIG. 4. FIG. 6 is a schematic, cross-sectional view taken along line II-II' of FIG. 4. Like regions, layers or elements are designated by like numeral numbers through the figures.

As can be seen in FIG. 4 and FIG. 6, according to the illustrative embodiment, the NVM cell $C_1$ comprises a first floating gate extension 222a continuously extending from the floating gate 222 to an OD region 100c and is adjacent to an erase gate (EG) region 30, which is coupled to an erase line EL. The first floating gate extension 222a traverses the trench isolation region 110 between the OD region 100a and the OD region 100c and partially overlaps with the OD region 100c so as to capacitively couple to the EG region 30. The first floating gate extension 222a may have a slender shape when viewed from the above and extends along a second direction or a reference y-axis.

According to the illustrative embodiment, the first floating gate extension 222a may comprise a P+ doped segment and an N+ doped segment with a P+/N+ interface 226 therebetween. The P+/N+ interface 226 is situated closer to the OD region 100a. According to the illustrative embodiment, the distance a between the P+/N+ interface 226 and the OD region 100a is smaller than the distance b between the P+/N+ interface 226 and the OD region 100c. The N+ implant region 401 and the P+ implant region 402 are also shown in FIG. 4 as indicated in dashed line. According to the illustrative embodiment, the distance a may be smaller than or equal to the overlapping region denoted as letter c between the ion well 101 and the trench isolation region 110 between the OD region 100a and the OD region 100c.

As can be seen in FIG. 4 and FIG. 5, according to the illustrative embodiment, the NVM cell $C_1$ further comprises a second floating gate extension 222b continuously extending along the first direction or reference x-axis from the first floating gate extension 222a. According to the illustrative embodiment, the second floating gate extension 222b may be orthogonal to the first floating gate extension 222a. The second floating gate extension 222b, which protrudes from a side edge of the slender first floating gate extension 222a, completely overlaps with the trench isolation region 110 between the OD region 100a and the OD region 100c when viewed from the above.

According to the illustrative embodiment, the entire second floating gate extension 222b is an N+ doped polysilicon. By disposing such additional geometric feature 222b in the NVM cell, the proportion of the area of the N+ doped segment relative to the entire floating gate extension 222a and 222b is enlarged and the erase performance is enhanced.

Figure 7:
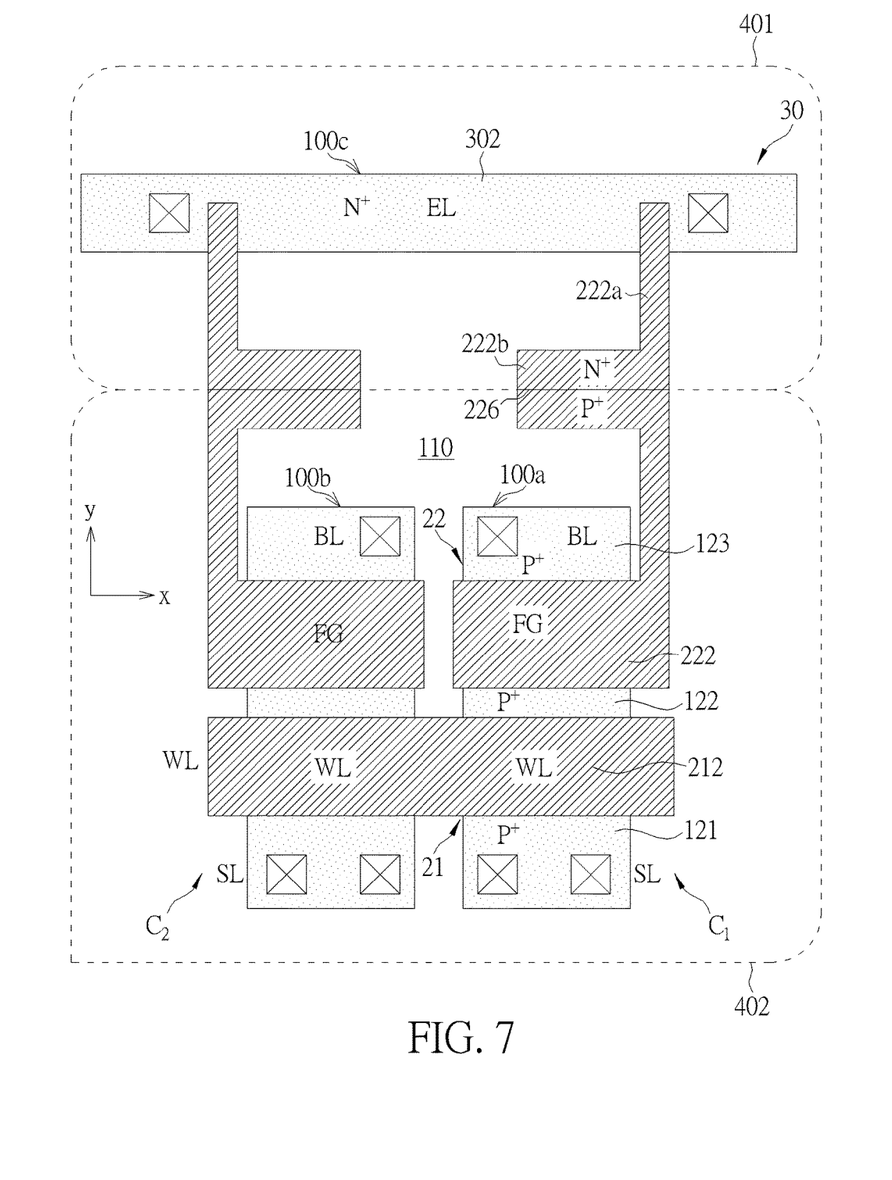
FIG. 7 is a schematic plan view showing an exemplary layout of a single-poly NVM cell in accordance with still another embodiment of this invention.

FIG. 7 is a schematic plan view showing an exemplary layout of a single-poly NVM cell in accordance with still another embodiment of this invention. As shown in FIG. 7, likewise, the single-poly NVM cell (e.g., cell $C_1$) comprises a second floating gate extension 222b continuously extending along the first direction or reference x-axis from the first floating gate extension 222a. The second floating gate extension 222b comprises P+ doped segment and N+ doped segment with a P+/N+ interface 226 therebetween. The position of the P+/N+ interface 226 in the second floating gate extension 222b can be adjusted to modulate the erase efficiency, and therefore over-erase can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nonvolatile memory (NVM) cell, comprising:
   a semiconductor substrate of a first conductivity type;
   a first oxide define (OD) region in the semiconductor substrate;
   a second oxide define (OD) region being spaced apart from the first OD region;
   an erase gate (EG) region disposed in the second OD region;
   a trench isolation region separating the first OD region from the second OD region;
   a select transistor disposed on the first OD region;
   a floating gate transistor serially connected to the select transistor and being disposed on the first OD region, wherein the floating gate transistor comprises a floating gate overlying the first OD region; and
   a first floating gate extension continuously extending from the floating gate to the second OD region, wherein the first floating gate extension comprises a P+ doped segment and an N+ doped segment with a P+/N+ interface therebetween, wherein the P+/N+ interface is situated closer to the first OD region.

2. The NVM cell according to claim 1, wherein the select transistor and the floating gate transistor are PMOS transistors and the select transistor and the floating gate transistor are disposed within an N well.

3. The NVM cell according to claim 2, wherein the semiconductor substrate is a P type doped silicon substrate.

4. The NVM cell according to claim 1 further comprising an isolation ion well of the first conductivity type disposed under the trench isolation region.

5. The NVM cell according to claim 1, wherein the first floating gate extension traverses the trench isolation region between the first OD region and the second OD region, and wherein the first floating gate extension partially overlaps with the second OD region so as to capacitively couple to the EG region.

6. The NVM cell according to claim 5, wherein the EG region is electrically coupled to an erase line, wherein a distal end of the $N^+$ doped segment of the first floating gate extension is capacitively coupled to the EG region.

7. The NVM cell according to claim 1 further comprising a heavily doped region of a second conductivity type within the second OD region and adjacent to the first floating gate extension.

8. The NVM cell according to claim 7 further comprising a lightly doped drain (LDD) region of the second conductivity type disposed within the second OD region and adjacent to the heavily doped region.

9. The NVM cell according to claim 1, wherein the select transistor comprises a source doping region of the first conductivity type, a common doping region of the first conductivity type, a select gate channel region between the source doping region and the common doping region, a select gate overlying the select gate channel region, and a select gate dielectric layer between the select gate and the select gate channel region.

10. The NVM cell according to claim 9, wherein the source doping region is electrically coupled to a source line.

11. The NVM cell according to claim 10, wherein the floating gate transistor further comprising the common doping region, a drain doping region of the first conductivity type, a floating gate channel region between the common doping region and the drain doping region, and a floating gate dielectric layer between the floating gate and the floating gate channel region.

12. The NVM cell according to claim 11, wherein the drain doping region is electrically coupled to a bit line.

13. The NVM cell according to claim 11, wherein the floating gate is a $P^+$ doped polysilicon gate.

14. The NVM cell according to claim 1, wherein a distance a between the $P^+/N^+$ interface and the first OD region is smaller than a distance b between the $P^+/N^+$ interface and the second OD region.

15. The NVM cell according to claim 14, wherein b/a ranges between 5 and 20.

16. The NVM cell according to claim 1 further comprising a second floating gate extension continuously extending from the first floating gate extension.

17. The NVM cell according to claim 16, wherein the second floating gate extension protrudes from a side edge of the first floating gate extension and completely overlaps with the trench isolation region between the first OD region and the second OD region.

* * * * *